(12) United States Patent
Domanovitz

(10) Patent No.: US 11,082,194 B2
(45) Date of Patent: *Aug. 3, 2021

(54) MULTIFUNCTIONAL AMPLIFIER

(71) Applicant: ACTELIS NETWORKS (ISRAEL) LTD, Petach Tikva (IL)

(72) Inventor: Elad Domanovitz, Mazkeret Batya (IL)

(73) Assignee: ACTELIS NETWORKS (ISRAEL) LTD., Petach Tikva (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/154,137

(22) Filed: Oct. 8, 2018

(65) Prior Publication Data

US 2020/0112422 A1 Apr. 9, 2020

(51) Int. Cl.
| | |
|---|---|
| *H04W 56/00* | (2009.01) |
| *H04L 5/14* | (2006.01) |
| *H03F 3/24* | (2006.01) |
| *H03K 19/17736* | (2020.01) |
| *H04B 7/26* | (2006.01) |

(52) U.S. Cl.
CPC ............ *H04L 5/1415* (2013.01); *H03F 3/24* (2013.01); *H03K 19/17744* (2013.01); *H04B 7/2643* (2013.01)

(58) Field of Classification Search
CPC ... H04L 5/1415; H03F 3/24; H03K 19/17744; H04B 7/2643
USPC .......................................................... 370/276
See application file for complete search history.

(56) References Cited

U.S. PATENT DOCUMENTS

| | | | | |
|---|---|---|---|---|
| 2007/0015462 | A1* | 1/2007 | Dean .................. | H04B 7/15557 455/15 |
| 2011/0274014 | A1* | 11/2011 | Du ........................ | H04W 24/02 370/278 |
| 2014/0161000 | A1* | 6/2014 | Fazlollahi ................ | H04B 3/32 370/280 |
| 2017/0055231 | A1* | 2/2017 | Cook ................ | H04W 52/0229 |

FOREIGN PATENT DOCUMENTS

| | | |
|---|---|---|
| JP | 2015204604 | 11/2015 |
| WO | WO 2017/199259 | 11/2017 |

OTHER PUBLICATIONS

Extended European Search Report for EP Application No. EP19201974. 3, dated Jan. 27, 2020.

* cited by examiner

*Primary Examiner* — Sai Ming Chan
(74) *Attorney, Agent, or Firm* — Pearl Cohen Zedek Latzer Baratz LLP

(57) ABSTRACT

A multifunctional amplifier for Time Division Duplex signals and Frequency Division Duplex signals in Very High Bit-Rate Subscriber Line, is disclosed. The multifunctional amplifier may include a first and second bidirectional terminals, at least one first filter connected between said first and second bidirectional terminals for bypassing signals in a first configuration, an amplifier circuit arranged in a signal path between first and second bidirectional terminals to amplify said signals, the amplifier circuit being operable in a second configuration for amplifying said signals in one direction along the signal path and a third configuration for amplifying said signals in the opposite direction along the signal path, and a control circuit arranged to control said amplifier circuit to change configuration.

7 Claims, 5 Drawing Sheets

VDSL2 17a 17.6 MHz

VDSL2 35b 17.6   35
MHz   MHz

MULTIFUNCTIONAL AMPLIFIER

FIELD OF THE INVENTION

The present invention relates to amplifiers for Digital Subscriber lines (DSL) for signals such as data signals, designed to amplify signals and thereby enable them to extend rate per given reach or to extend coverage for a given service.

BACKGROUND OF THE INVENTION

The demand for higher data rates is continuously increasing, which makes improvements of network architecture necessary.

G.Fast aims to provide ultra-high speeds over copper twisted pairs, up to and sometimes even exceeding speeds of 1 Gbps. Originally, the planned loop lengths for G.Fast were from 50 to 250 meters (150 to 750 feet). Current implementations reach up to 500 meters. G.Fast is being standardized as the ITU Telecommunication Standardization Sector (ITU-T) Recommendation G.9701. Similar to currently deployed technologies, G.Fast supports vectoring, which reduces far-end crosstalk that is generated in multi-pair deployments and is a significant impairment at higher frequencies. The first version of G.Fast operates over frequencies of up to 106 MHz, and uses linear vector pre-coding to eliminate cross-talk in both downstream and upstream directions. A future version of G.Fast may operate over frequencies of up to 212 MHz, and may support higher-performance non-linear pre-coding to allow for even higher speeds.

G.Fast uses time-division duplexing (TDD).

VDSL2 is being standardized as ITU-T Recommendation G.993.2. VDSL2 permits the transmission of asymmetric and symmetric aggregate data rates up to 300+Mbits/s downstream and upstream on twisted pairs using a bandwidth up to 35 MHz. The VDSL2 standard defined a wide range of profiles that can be used in different VDSL2 deployment architectures. Recently, a new flavor of VDSL2 was approved in the ITU, being standardized as ITU-T Recommendation G.993.2, VDLS2 profile 35b.

VDLS2 uses frequency-division duplexing (FDD).

FIG. 1A shows a prior art frequency band plan for a VDSL2 profile 17a, and FIG. 1B shows frequency band assignments for VDLS2 profile 35b FIG. 2 illustrates a prior art comparison between performance of v17a, v35b and G.fast. V35b gives significant advantages over VDLS2 vectoring or G.Fast:

- Up to double the speed of VDLS2 on loops shorter than 550 meters
- Higher speeds than G.fast beyond 250 meters and higher density (100-200 subscribers)
- A seamless upgrade path from VDLS2 vectoring (17a)
- The 35 MHz frequency range keeps down equipment costs and footpring compared to G.fast
- Less complex equipment increases subscriber density, which is critical at medium loop lengths.

SUMMARY OF THE INVENTION

According to some embodiments of the presentation, there is provided a multifunctional amplifier for Time Division Duplex (TDD) in a TDD Digital Subscriber line (DSL) and Frequency Division Duplex (FDD) signals in Very High Bit-Rate Subscriber Line (VDSL2). The multifunctional amplifier may include first and second bidirectional terminals, at least one first filter connected between said first and second bidirectional terminals for bypassing signals in a first configuration, an amplifier circuit arranged in a signal path between first and second bidirectional terminals to amplify said signals, the amplifier circuit being operable in a second configuration for amplifying said signals in one direction along the signal path and a third configuration for amplifying said signals in the opposite direction along the signal path, and a control circuit arranged to control said amplifier circuit to change configuration.

In another embodiment of the present invention, there is provided an electronic circuit installed over copper lines. The electronic circuit may include first bidirectional terminals and second bidirectional terminals both for signals in first and second different frequency spectrums, at least one first filter connected between the first and the second terminals for bypassing signals in a first configuration and an amplifier circuit arranged in a signal path between the first and the second bidirectional terminals to amplify signals received at one of said first bidirectional terminals for transmission from one of said second bidirectional terminals, the amplifier circuit being operable in a second configuration.

In another embodiment of the present invention, there is provided a communication system. The communication system includes a customer provider equipment for sending Frequency Division Duplex (FDD) signals to and receiving FDD signals from service provider equipment in a Very High Bit-Rate Subscriber Line (VDSL2), a first bidirectional terminals and second bidirectional terminals both for signals in first and second different frequency spectrums, at least one first filter connected between the first and the second terminals for bypassing signals in a first configuration, and an amplifier circuit arranged in a signal path between the first and the second bidirectional terminals to amplify signals received at one of the first bidirectional terminals for transmission from one of the second bidirectional terminals, the amplifier circuit being operable in a second configuration. The customer provider equipment may include a power feeding unit arranged to feed power via wires which also serves for transmission of said FDD signals These additional, and/or other aspects and/or advantages of the present invention are set forth in the detailed description which follows.

BRIEF DESCRIPTION OF THE DRAWINGS

For a better understanding of the invention and in order to show how it may be implemented, references are made, purely by way of example, to the accompanying drawings in which like numerals designate corresponding elements or sections. In the accompanying drawings:

FIG. 1A shows frequency band plan for a VDSL2 profile 17a, FIG. 1B shows frequency band assignments for VDLS2 profile 35b;

FIG. 2 illustrates a comparison between performance of v17a, v35b and G.fast;

FIG. 3 is a block diagram showing major functional blocks and the direction of signal flow, for V35b amplifier implementation, according to some embodiments of the invention;

FIG. 4 illustrates a system of the invention in which a V35b amplifier is fed using a reverse power feeding (RPF) unit, according to some embodiments of the present invention;

Figure 5:
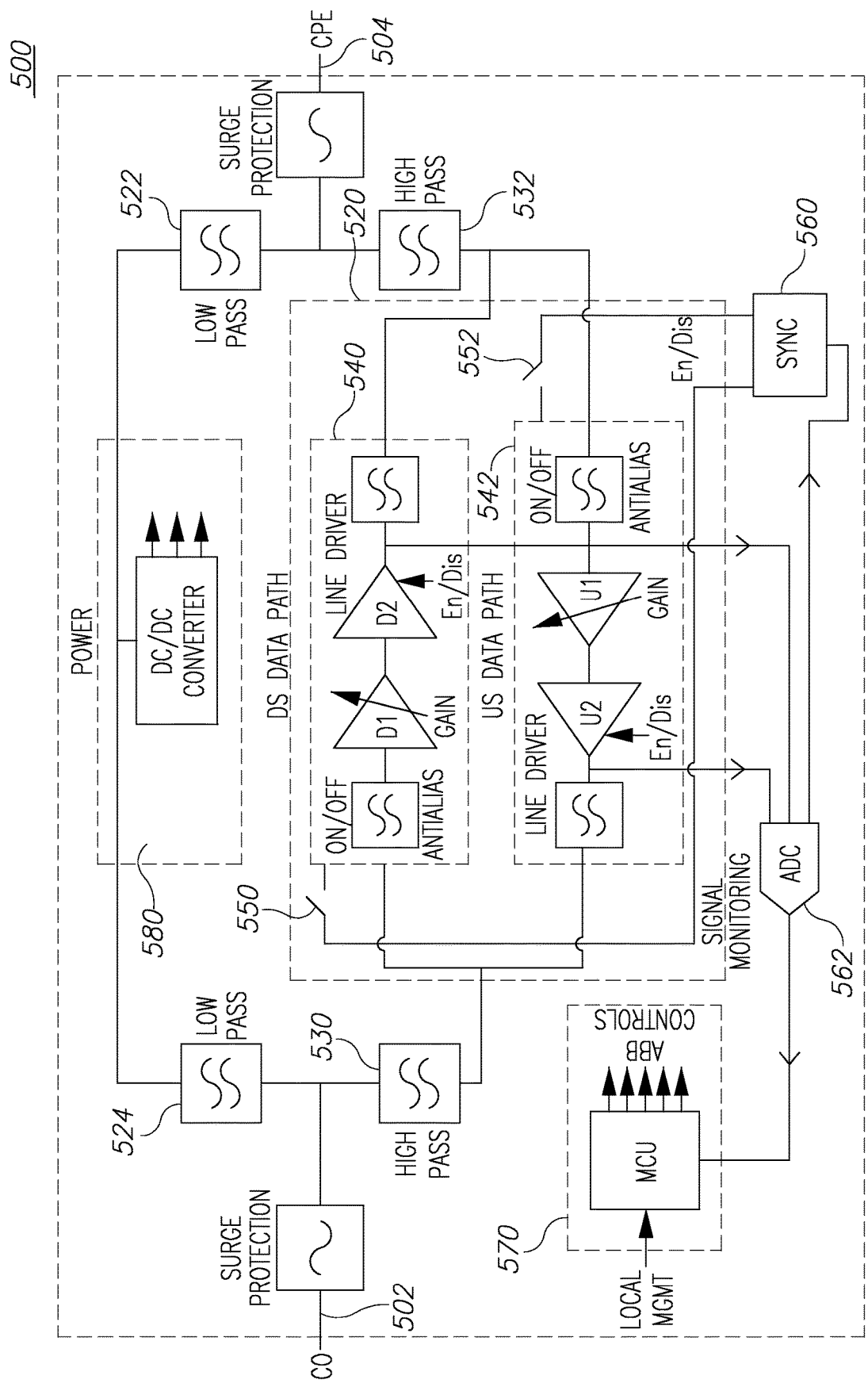

FIG. 5 is a block diagram showing major functional block and the direction of signal flow, for a multifunctional amplifier, according to some embodiments of the present invention.

The drawings together with the following detailed description make the embodiments of the invention apparent to those skilled in the art.

DETAILED DESCRIPTION OF THE INVENTION

With specific reference now to the drawings in detail, it is stressed that the particulars shown are for the purpose of example and solely for discussing the preferred embodiments of the present invention and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings makes apparent to those skilled in the art how the several forms of the invention may be embodied in practice.

Before the embodiments of the invention are explained in detail, it is to be understood that the invention is not limited in its application to the details of construction and the arrangement of the components set forth in the following descriptions or illustrated in the drawings. The invention is applicable to other embodiments and may be practiced or carried out in various ways. Also, it is to be understood that the phraseology and terminology employed herein is for the purpose of description and should not be regarded as limiting.

Some embodiments of the present invention may be used to provide an analog amplifier which is inserted over copper line at an appropriate distance between the CO and CPE. It is an apparatus which bypasses uplink and downlink signals in a first configuration of the frequency bands and amplifies downlink signals in a second configuration of the frequency band. It may be used to support the industry requirement ITU-T Recommendation G.993.2, VDLS2 profile 35b.

Some embodiments of the present invention may be used to provide a multifunctional amplifier, designed to amplify signals to extend rate per given reach or to extend coverage for a given service such as G.Fast or VDSL2.

Figure 1A:
Figure 1B:
Figure 2:
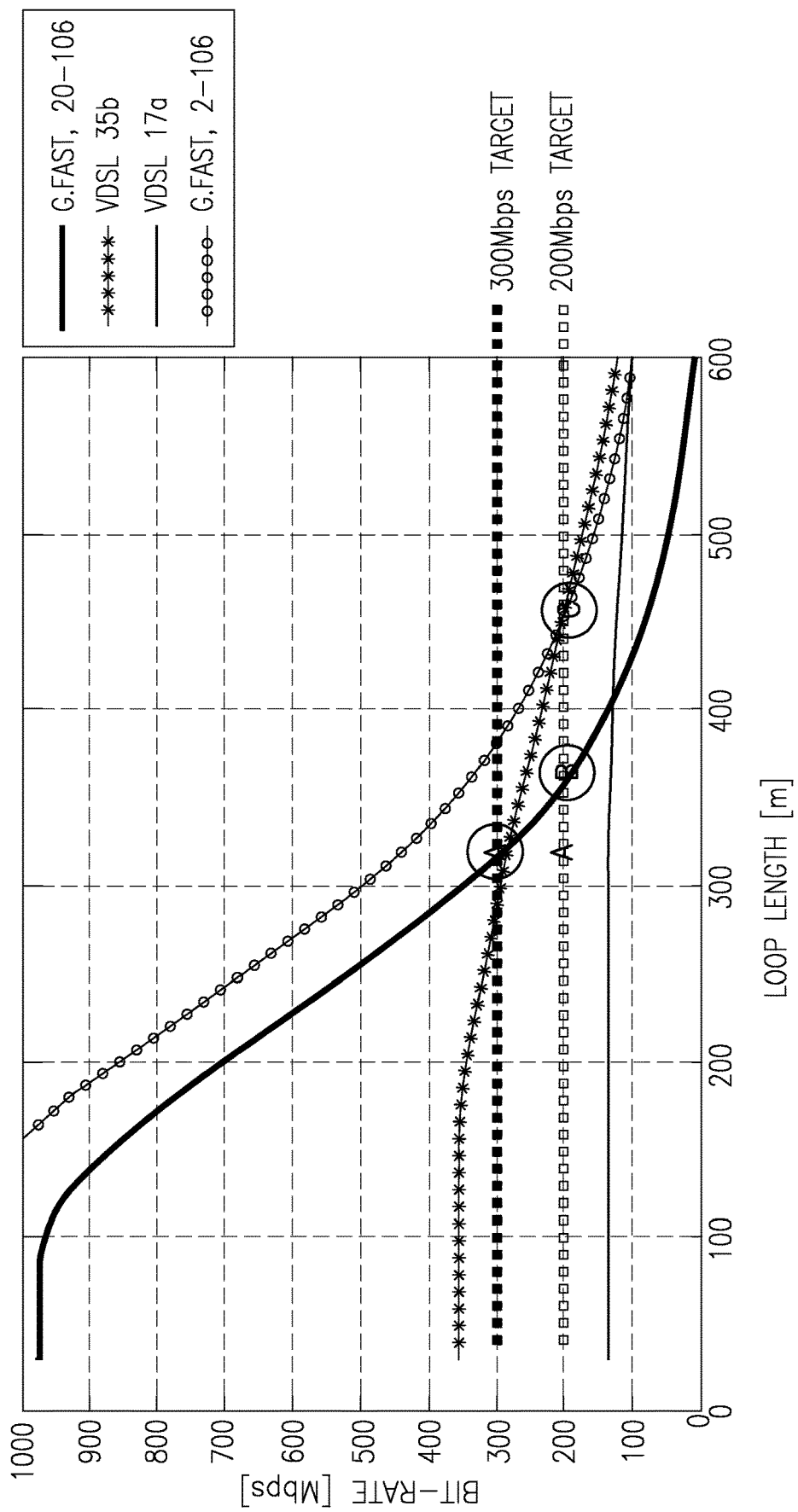
Figure 3:
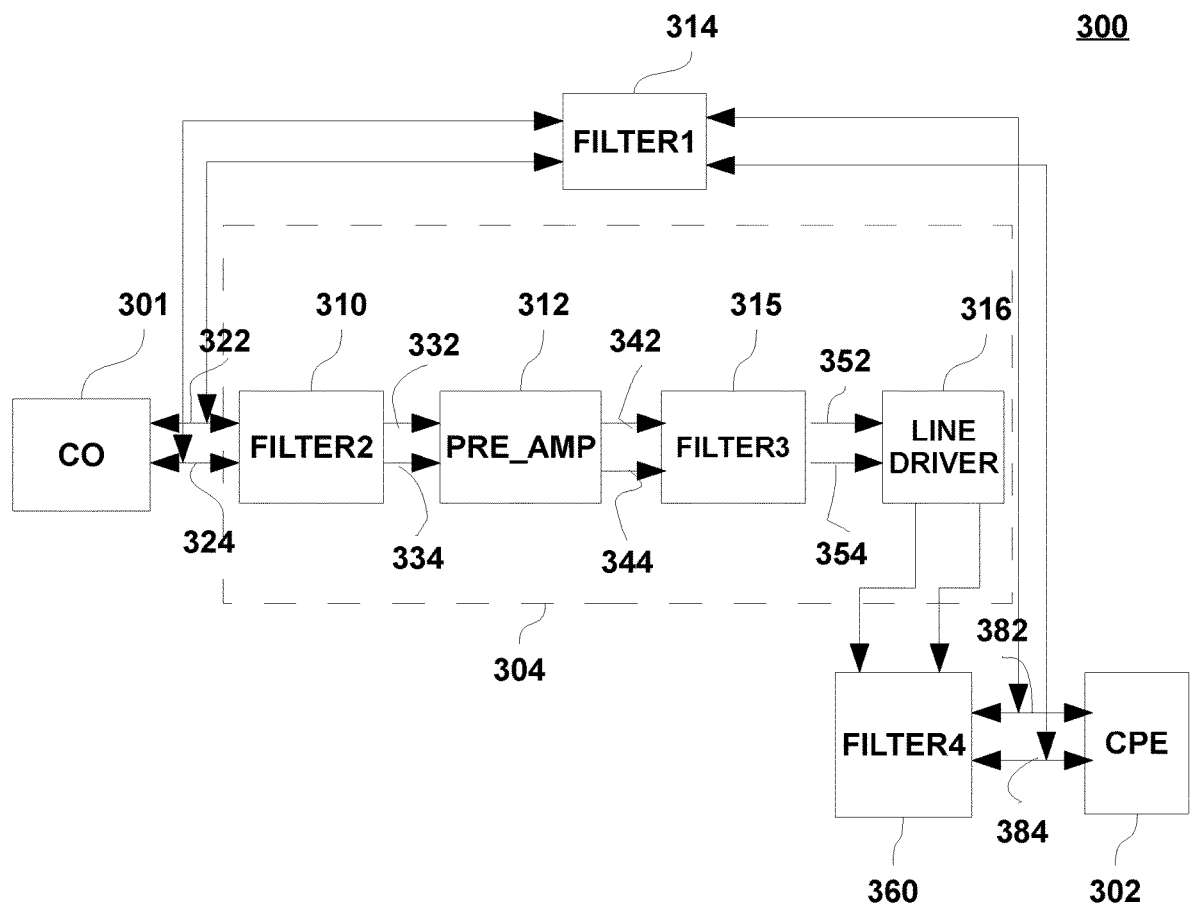

FIG. 3 illustrates one embodiment of the present invention an analog amplifier 300, for VDSL2 system. The example frequency band assignments for an VDSL2 signal are shown in FIGS. 1A and 1B. It comprises a first bidirectional terminal on the CO side 301 and a second bidirectional terminal on the CPE side 302. Conventionally the direction from CO to CPE is referred as downlink or DS, and the direction from the CPE to the CO is referred as the uplink or US, although signals pass in both directions.

Looking first at the end connected with the CO, the first element is FILTER1 which is a low-pass filter 314, may be needed to filter out uplink and downlink signals 322 and 324 according to a first frequency spectrum configuration, e.g. up to 17.6 MHz, leaving the desired downlink signal. High pass filters 310 and 360 may extract downlink data signals above a second frequency spectrum configuration, e.g. 17.6 MHz. FILTER1 is connected to the CO side by lines 322 and 324 and connected to the CPE side by lines 382 and 384.

An amplifier circuit 304 is arranged in the signal path between the high pass filters 310 and 360. Amplifier circuit 304 amplifies signals in one direction, the DS direction. Circuit amplifier 304 includes the usual components known to those skilled in the art such as not limited to variable gain amplifier PRE-AMP 312 or line driver 316. PRE-AMP 312 is connected to FILTER2 310 by lines 332 and 334 and may provide up to approximately 30 db of gain to the downlink signal. FILTER3 315 is connected to PRE-AMP 312 by lined 342 and 344 and may be used to shape the amplification curve.

According to an embodiment of the present invention, filter FILTER4 may be optional. It has three main purposes:
- impedance matching (input/output impedance of amplifier should be isolated the frequencies which are not meant to be amplified (for example the range 0-17.6 MHz);
- avoid oscillation via (output) high-pass—it may be done by steep curve of amplifier); and
- block noise of line driver at the frequencies which are not meant to be amplified (for example the range 0-17.6 MHz).

Figure 4:
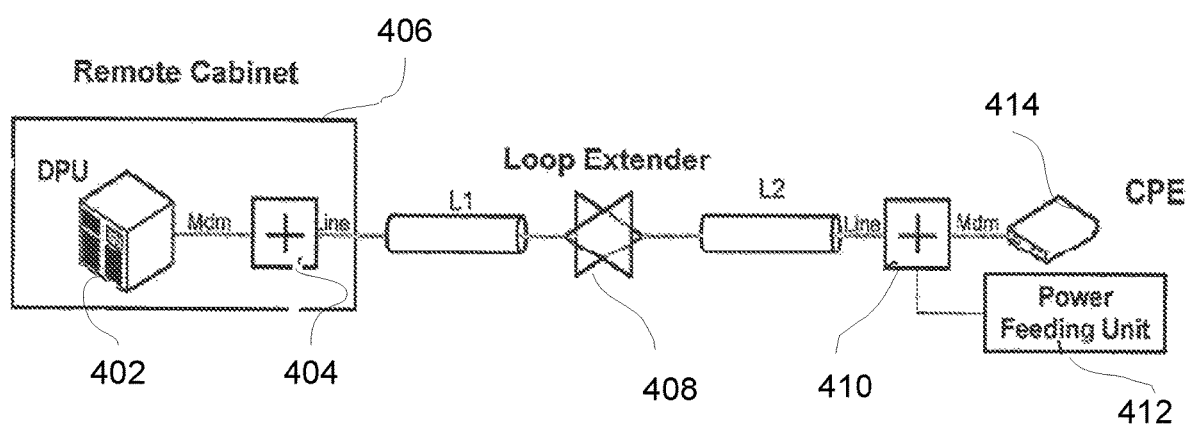

A Distribution Point (DP) may require power. Reverse power feeding (RPF) can be used to feed a DPU (DLSAM) on the CO or DP side According to some embodiments of the present invention, the CPE may include a power feeding unit, as shown in FIG. 4. Thus, a system 400 according to some embodiments of the invention comprises an electronic circuit and a customer premise equipment including a power feeding unit (RPF) 412. The service provider apparatus in some systems may include a DPU 402 and a modem 404 modulating or demodulating signals. DPU 402 and modem 404 may be located at a DP. A loop extender 408 is connected by respective lengths of wire L1 and L2 between the CO, shown as remote cabinet 406 and the CPE 414.

Some embodiments of the present invention may be used to provide a multifunctional amplifier, designed to amplify signals to extend rate per given reach or to extend coverage for a given service in TDD system such as G.Fast or FDD system such as VDSL2.

FIG. 5 shows a multifunctional amplifier 500, designed to amplify signals to extend rate per given reach or to extend coverage for a given service.

According to some embodiments of the present invention, the multifunctional amplifier 500 may be used to provide means for the extension of the G.Fast service, for example to enable signals to be propagated over greater distance.

According to some embodiments of the present invention, the multifunctional amplifier 500 may be used to provide an amplifier for the VDSL2 35b.

The multifunctional amplifier 500 comprises a first bidirectional terminal 502 on the CO side and a second bidirectional terminal 504 on the CPE side. A multifunctional amplifier according to some embodiments of the present invention may be installed in systems using different kinds of transmission media including but not limited to wire, e.g., copper. An amplifier circuit 520 is arranged in the signal path between the high pass filters 530 and 532. Amplifier circuit 520 includes a first amplifier or line driver 540 for amplifying signals in one direction, DS, and a second amplifier of line driver 542 for amplifying signals in the opposite direction. Each amplifier 540, 542 supplies signals, e.g., data signals to an analog convertor ADC 562. ADC 562 is used to detect signals output from the respective amplifiers 540, 542. The output from the ADC 562 is connected to a control or SYNC circuit 560.

The amplifier circuit 520 is operable in a first configuration for amplifying signals in one direction along the signal path and a second configuration for amplifying signals in the opposite direction along the signal path.

In any TDD system operating according to current standards, there is a "guard interval" between the end of the DS transmission and the beginning of the US transmission and vice versa. During the guard interval no data signals are transmitted. Utilizing the fact that there is a guard interval between the end of transmission at the DS direction the beginning of transmission at the US (and vice versa), according to some embodiments of the invention a system is proposed which may avoid the problem of instability. This may be achieved according to embodiments of the invention by enabling amplification only at the direction of transmission (and disabling amplifiers at the other direction). According to some embodiments of the invention, a detector is used to detect when transmission is stopped, or at least when transmission of data is stopped, or there is a silence period or interruption in transmission. In response to detection of a silence period or interruption, amplification may be disabled in one direction an enabled in the opposite direction. For example, if transmission stops at the DS direction, amplification in this direction may be disabled and amplification in the US direction may be enabled and vice versa.

A logical circuit or microcontroller unit MCU 570 may be used to detect if the multifunctional amplifier 500 may be used for TDD service, e.g., G.Fast service or an FDD service, e.g., a VDSL2 V35b service (in TDD, the signal into the ADC 562 is dropping during the guard time, where in FDD the signal is stable).

In case of FDD, the control circuit 560 is arranged to disconnect switch 552 (e.g., switch 552 in open state) to disable any amplification in the US data path between the bidirectional terminals 510, 520 and is arranged to connect switch 540 (switch 540 in close state) to enable any amplification in the DS data path between the bidirectional terminals 510, 520.

In case of TDD, the control circuit 560 is arranged to detect a silent period or interruption in the signals, for example in signals in one of the first and second bidirectional terminals 510 and 520, such as the guard period. In response to detection of interruption, according to some embodiments of the invention, the control circuit 560 is arranged to control the amplifier circuit 520 to change configuration.

In case of G.Fast service, incoming signals are filtered by low pass filters 524 and 522 to pass voice signals and in the downstream direction to extract direct current "DC". High pass filters 530 and 532 extract data signals. Extracted DC is transformed in DC/DC convertor 580 to provide power to components of the multifunctional amplifier 500.

In case of VDSL2 35b, low pass filters 524 and 522 are equivalent to FILTER1 described previously and shown at FIG. 3. The control unit 560 set DS amplification constantly. Amplification block 540 is equivalent to amplification block 304 described previously and shown at FIG. 3. High pass filters 530 and 532 are equivalent to blocks 310 and 360 described previously and shown at FIG. 3.

The figures described herein are block diagrams which illustrate the architecture, functionality, and operation of possible implementations of systems and methods according to various embodiments of the present invention. It should also be noted that, in some alternative implementations, the functions noted in the blocks may occur out of the order noted in the figures and the components of the blocks may be discrete or may be combined in different ways.

In the above description, an embodiment is an example or implementation of the inventions. The various appearances of "one embodiment," "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

It is to be understood that the phraseology and terminology employed herein is not to be construed as limiting and are for descriptive purpose only.

Furthermore, it is to be understood that the invention can be carried out or practiced in various ways and that the invention can be implemented in embodiments other than the ones outlined in the description above.

It is to be understood that the terms "including", "comprising", "consisting" and grammatical variants thereof do not unless otherwise stated preclude the addition of one or more components, features, steps, or integers or groups thereof and that the terms are to be construed as specifying components, features, steps or integers.

If the specification or claims refer to "an additional" element, that does not preclude there being more than one of the additional elements unless otherwise stated.

It is to be understood that where the claims or specification refer to "a" or "an" element, such reference is not being construed that there is only one of that element.

It is to be understood that where the specification states that a component, feature, structure, or characteristic "may", "might", "can" or "could" be included, that particular component, feature, structure, or characteristic is not required to be included.

Where applicable, although state diagrams, flow diagrams or both may be used to describe embodiments, the invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A multifunctional amplifier for Time Division Duplex (TDD) signals in a TDD Digital Subscriber Line (DSL) and Frequency Division Duplex (FDD) signals in Very High Bit-Rate Subscriber Line (VDSL2), comprising:
   first and second bidirectional terminals;
   at least one first filter connected between said first and second bidirectional terminals for bypassing signals in a first configuration;
   an amplifier circuit arranged in a signal path between said first and second bidirectional terminals to amplify said signals, said amplifier circuit being operable in a second configuration for amplifying said signals in one direction along the signal path and a third configuration for amplifying said signals in the opposite direction along the signal path;
   a control circuit configured to monitor a guard interval of the signals between said first and second bidirectional terminals, and, in a case a drop of the signals during the guard interval is detected, to set the amplifier to operate for G.Fast service, and in a case the signal is stable, set the amplifier for VDSL2 V35b service.

2. The multifunctional amplifier according to claim 1, wherein the control circuit is further comprising a logical circuit to detect if signals between said first and said second bidirectional terminals are TDD signals, and in case said signals are TDD signals, said control circuit is arranged to detect a silent period in said signals in case of TDD signals and in response to detecting a silent period, control said amplifier circuit to change configuration.

3. The multifunctional amplifier according to claim 1, wherein the control circuit is further comprising a logical circuit to detect if signals between said first and said second bidirectional terminals are FDD signals, and in case said signals are FDD signals, said control circuit is arranged to control said amplifier circuit to change configuration.

4. An electronic circuit installed over copper lines, comprising:
- first bidirectional terminals and second bidirectional terminals both for signals in first and second different frequency spectrums;
- at least one first filter connected between said first and second terminals for bypassing signals in a first configuration;
- an amplifier circuit arranged in a signal path between said first and second bidirectional terminals to amplify signals received at one of said first bidirectional terminals for transmission from one of said second bidirectional terminals, said amplifier circuit being operable in a second configuration,
- wherein said copper lines connect said first bidirectional terminals and said second bidirectional terminals via said first filter and said amplifier circuit.

5. A communication system, the communication system comprising:
- customer provider equipment for sending Frequency Division Duplex (FDD) signals to and receiving FDD signals from service provider equipment in a Very High Bit-Rate Subscriber Line (VDSL2);
- first bidirectional terminals and second bidirectional terminals both for signals in first and second different frequency spectrums;
- at least one first filter connected between said first and second terminals for bypassing signals in a first configuration; and
- an amplifier circuit arranged in a signal path between said first and second bidirectional terminals to amplify signals received at one of said first bidirectional terminals for transmission from one of said second bidirectional terminals, said amplifier circuit being operable in a second configuration,
- wherein said customer provider equipment comprises a reverse power feeding (RPF) unit arranged to feed power via wires which also serve for transmission of said FDD signals.

6. The multifunctional amplifier according to claim 1, wherein in case of the VDSL2 V35b service mode, the control circuit disables any amplification in an upstream data path between the bidirectional terminals enables any amplification in a downstream data path between the bidirectional terminals.

7. The multifunctional amplifier according to claim 1, wherein in case of G.Fast service mode, the control unit causes incoming signals to be filtered by low pass filters and to pass voice signals and in a downstream direction to extract direct current (DC) and further cause high pass filters to extract data signals, wherein said extracted DC is transformed via a DC/DC convertor to provide power to the multifunctional amplifier.

* * * * *